United States Patent
Chien

(10) Patent No.: US 6,259,607 B1
(45) Date of Patent: Jul. 10, 2001

(54) EJECTOR DEVICE FOR A MOBILE MODULE

(75) Inventor: Chung-Chi Chien, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 09/377,185

(22) Filed: Aug. 19, 1999

(51) Int. Cl.[7] .................................................. H05K 7/14
(52) U.S. Cl. .................. 361/754; 361/736; 361/741; 361/754; 361/801; 361/802; 361/726; 361/725; 439/160
(58) Field of Search ..................................... 361/728, 736, 361/740, 741, 752, 754, 732, 801, 802, 726, 725; 439/157, 152, 160

(56) References Cited

U.S. PATENT DOCUMENTS

| | | | |
|---|---|---|---|
| 5,140,501 | * 8/1992 | Takahashi et al. | 361/798 |
| 5,432,682 | * 7/1995 | Giehl et al. | 361/796 |
| 5,507,658 | * 4/1996 | Ho | 439/159 |
| 5,597,316 | * 1/1997 | David et al. | 439/159 |
| 5,675,475 | * 10/1997 | Mazura et al. | 361/798 |
| 5,793,607 | * 8/1998 | Karidis et al. | 361/784 |
| 5,793,614 | * 8/1998 | Tollbom | 361/732 |
| B1 6,169,662 | * 1/2001 | Clark et al. | 361/754 |
| B1 6,185,106 | * 2/2001 | Mueller | 361/798 |

FOREIGN PATENT DOCUMENTS

410032041A * 2/1998 (JP).
02000133380A * 5/2000 (JP).

* cited by examiner

Primary Examiner—Jeffrey Gaffin
Assistant Examiner—David Foster
(74) Attorney, Agent, or Firm—Pillsbury Winthrop LLP

(57) ABSTRACT

An ejector device for removing a mobile module from a main board includes a support frame and a lever. The support frame is secured on the main board so as to extend in a direction transverse to a plane of the main board, and is disposed adjacent to the mobile module. The lever includes an ejecting plate portion disposed between the main board and the mobile module, a connecting plate portion and an operating plate portion. The connecting plate portion extends from the ejecting plate portion, and is disposed between the support frame and the mobile module. The connecting plate portion is mounted pivotally on the support frame about an axis parallel to the plane of the main board. The operating plate portion extends from the connecting plate portion, and is operable to cause the connecting plate portion to pivot relative to the support frame and enable the ejecting plate portion to push the mobile module away from the main board.

1 Claim, 4 Drawing Sheets

US 6,259,607 B1

EJECTOR DEVICE FOR A MOBILE MODULE

BACKGROUND OF THE INVENTION

1. Field of the Invention

The invention relates to an ejector device, more particularly to an ejector device for a mobile module.

2. Description of the Related Art

A mobile module (MMO) used in notebook computers includes a circuit board, a central processing unit (CPU) mounted on one side of the circuit board, and a plurality of module terminals mounted on the other side of the circuit board proximate to one edge of the latter. The module terminals are inserted into corresponding board terminals on a main board to establish electrical connection between the mobile module and the main board.

During testing of a main board that incorporates several mobile modules, there is a need for repeated replacement of the mobile modules. Currently, replacement is performed via manual removal of the mobile modules, which can result in damage to the module terminals due to uneven application of forces. It has been proposed heretofore to use dedicated equipment for removing mobile modules from main boards to alleviate the drawback of damage to the module terminals. However, since mobile modules typically have different size specifications, manufacturers need corresponding equipment with different specifications, thereby resulting in increased production costs. Moreover, when consumers upgrade their computers, no device is available to aid them in the removal of the mobile modules from the main boards. As such, consumers usually remove the mobile modules by hand during replacement, thereby arising in the aforesaid drawback of damage to the module terminals.

SUMMARY OF THE INVENTION

Therefore, the object of the present invention is to provide an ejector device adapted to be installed on a main board to facilitate removal of a mobile module by both manufacturers and consumers regardless of the size specification of the mobile module without causing any damage to the module terminals.

Accordingly, the ejector device of this invention is adapted for removing a mobile module from a main board. The mobile module includes a circuit board, a processing unit mounted on one side of the circuit board, and a set of module terminals mounted on the other side of the circuit board opposite to the processing unit. The module terminals are disposed proximate to one edge of the circuit board, and are inserted removably into the main board for establishing electrical connection between the mobile module and the main board. The ejector device comprises a support frame and a lever. The support frame is adapted to be secured on the main board so as to extend in a direction transverse to a plane of the main board, and is adapted to be disposed adjacent to said one edge of the circuit board. The lever includes an ejecting plate portion that is adapted to be disposed between the main board and the circuit board of the mobile module, a connecting plate portion, and an operating plate portion. The connecting plate portion extends from the ejecting plate portion, and is adapted to be disposed between the support frame and said one edge of the circuit board. The connecting plate portion is mounted pivotally on the support frame about an axis parallel to the plane of the main board. The operating plate portion extends from the connecting plate portion, and is operable to cause the connecting plate portion to pivot relative to the support frame and enable the ejecting plate portion to push the circuit board of the mobile module away from the main board for removing the module terminals of the mobile module from the main board.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
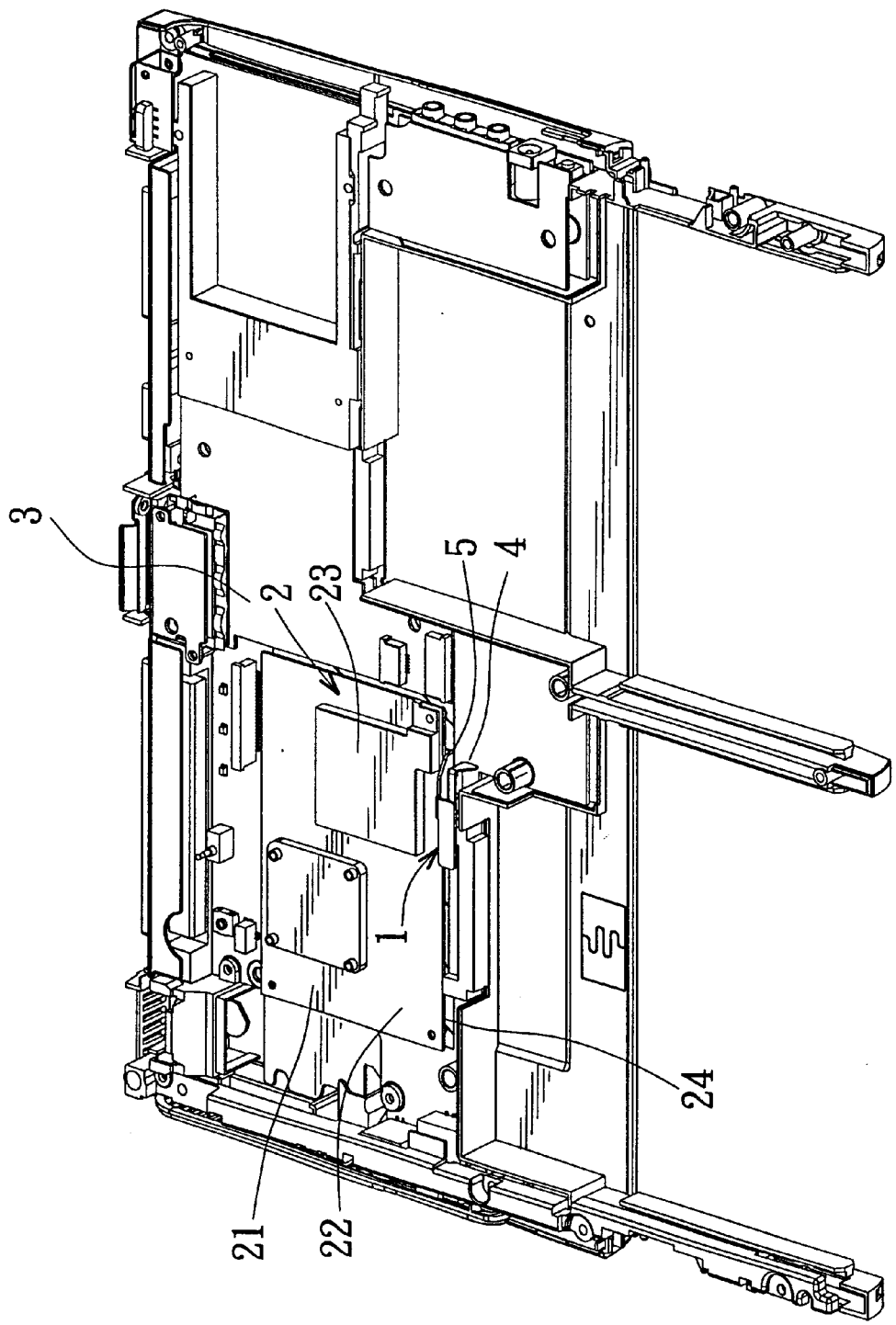
FIG. 1 is a perspective view illustrating a main board that incorporates a mobile module and the preferred embodiment of an ejector device according to the present invention.

Referring to FIG. 1, the preferred embodiment of an ejector device 1 according to the present invention is shown to be adapted for use with a main board 3 having a mobile module 2 disposed removably thereon. The mobile module 2 includes a circuit board 21, a central processing unit 23 mounted on one side 22 of the circuit board 21, and a plurality of module terminals (not shown) mounted on the other side of the circuit board 21 opposite to the central processing unit 23. The module terminals are disposed proximate to one edge 24 of the latter. Several integrated circuit chips (not shown) are usually provided on said one side 22 of the circuit board 21 to enable the mobile module 2 to function as a chipset. The module terminals are inserted removably into corresponding board terminals (not shown) on the main board 3 to establish electrical connection between the mobile module 2 and the main board 3.

The ejector device 1 is adapted to be installed on the main board 3 prior to mounting of the mobile module 2 on the main board 3, and includes a support frame 4 and a lever 5.

Figure 2:
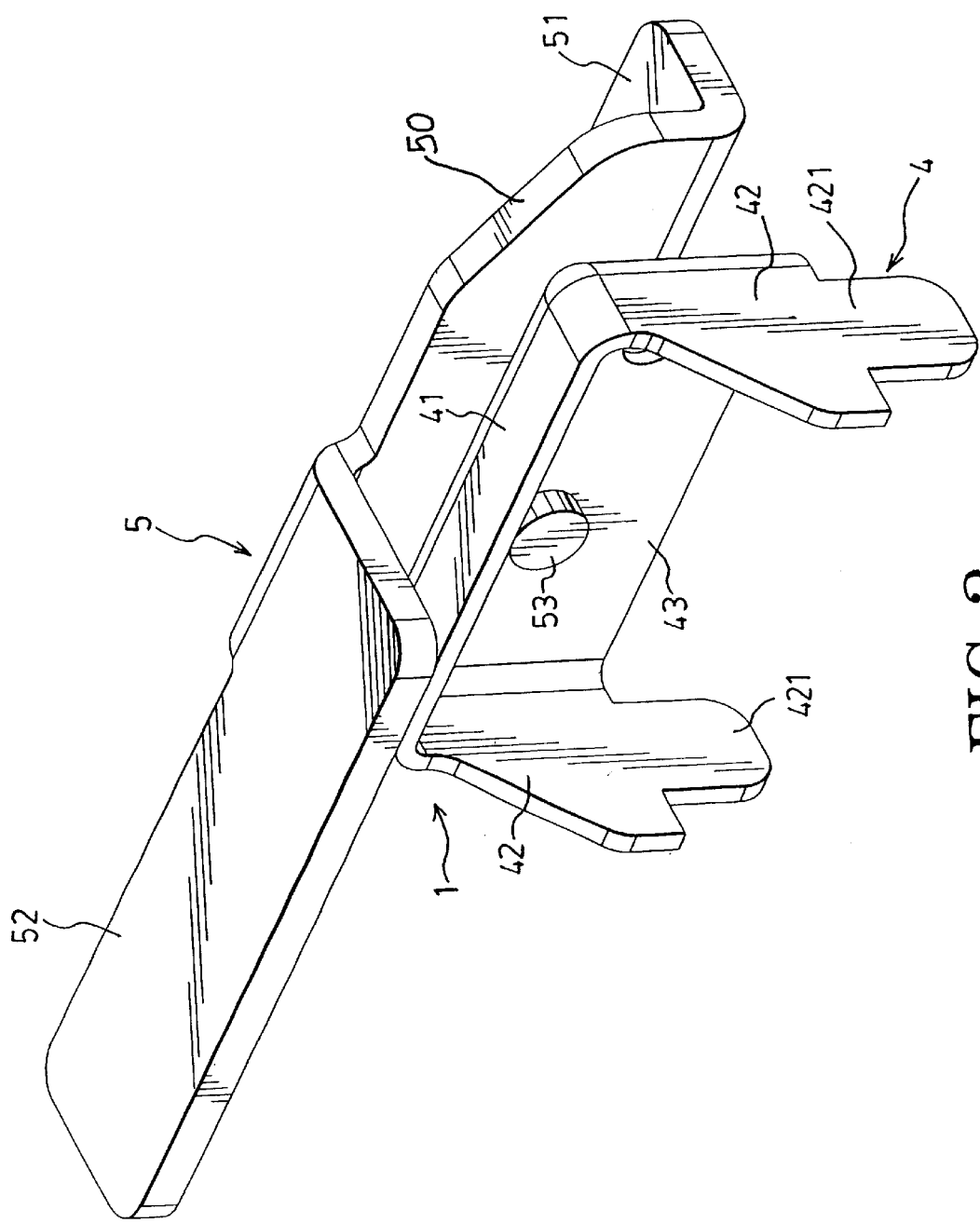
FIG. 2 is a perspective view of the preferred embodiment.
Figure 3:
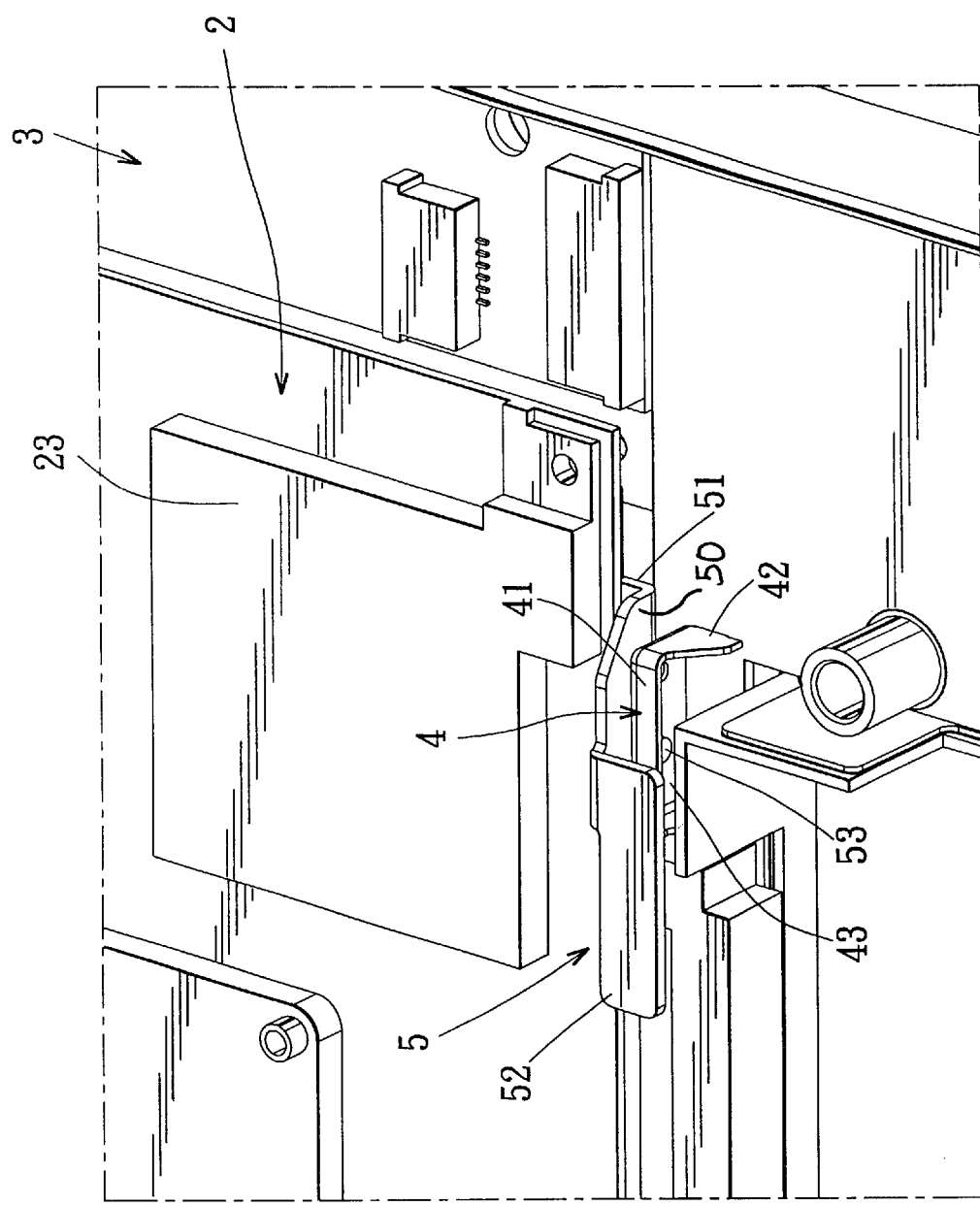
FIG. 3 is an enlarged perspective view illustrating the preferred embodiment when applied to the main board and the mobile module.
Figure 4:
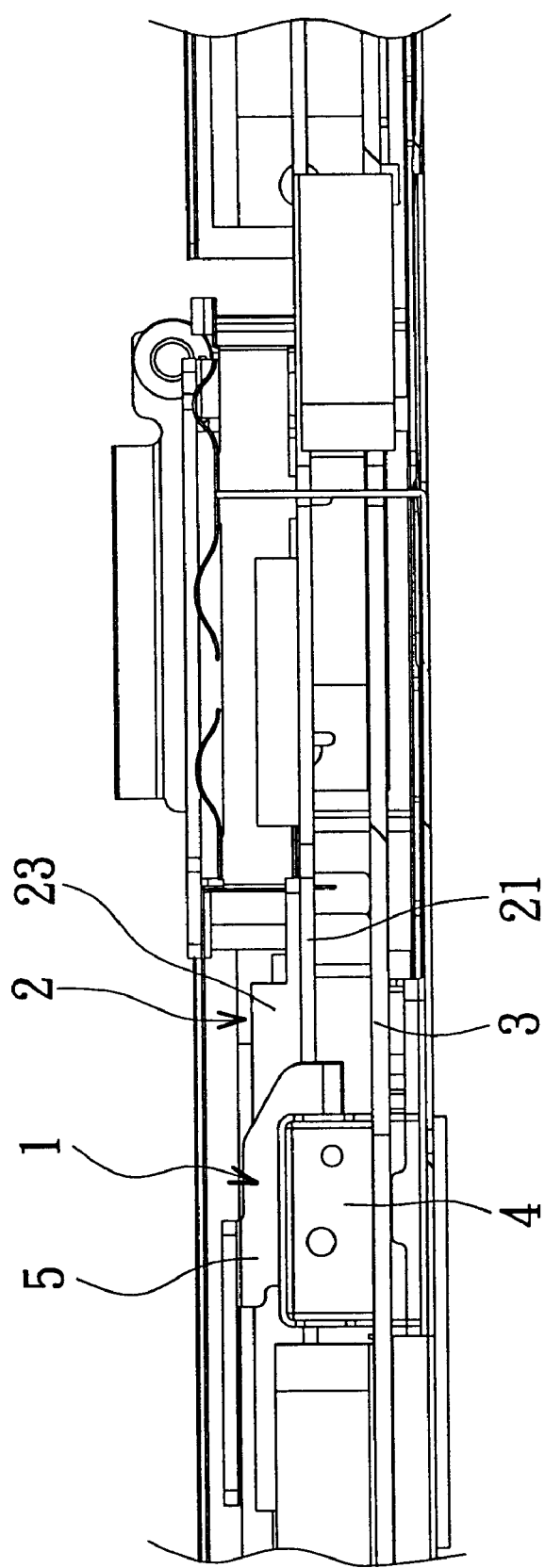
FIG. 4 is a schematic side view illustrating the preferred embodiment when applied to the main board and the mobile module.

With further reference to FIGS. 2 to 4, the support frame 4 is in the form of an inverted U, and includes a horizontal first wall 41 and a parallel pair of vertical second walls 42 that extend transversely and respectively from opposite ends of the first wall 41. Each of the second walls 42 has a clistal end 421 formed with an insert flange 421 that is adapted for insertion into the main board 3. Thus, the support frame 4 is secured on the main board 3 so as to extend in a direction transverse to a plane of the main board 3 and so as to be disposed adjacent to said one edge 24 of the circuit board 21 when the mobile module 2 is provided on the main board 3. The support frame 4 further includes a third wall 43 extending between the second walls 42 for mounting pivotally the lever 5 thereon.

The lever 5 is an elongate member have an ejecting plate portion 51 that is adapted to be disposed between the main board 3 and the circuit board 21 of the mobile module 2, a connecting plate portion 50 that extends transversely from the ejecting plate portion 51 and that is adapted to be disposed between the third wall 43 of the support frame 4 and said one edge 24 of the main board 3, an operating plate portion 52 that extends transversely from one edge of the connecting plate portion 50 opposite to the ejecting plate portion 51, and a pivot 53 for mounting pivotally the connecting plate portion 50 on the third wall 43 of the support frame 4 about an axis parallel to the plane of the main board 3.

When it is desired to remove the mobile module 2 from the main board 3, a force is applied on the operating plate portion 52 of the lever 5 to cause the connecting plate portion 53 to pivot relative to the support frame 4 and move the ejecting plate portion 51 away from the main board 3, thereby pushing the circuit board 21 of the mobile module 2 away from the main board 3 to remove the module terminals (not shown) of the mobile module 2 from the main board 3.

Because the ejector device 1 is installed directly on the main board 3, removal of mobile modules 2 having different size specifications from the main board 3 can be facilitated and performed by both manufacturers and consumers as the need for dedicated equipment to accomplish the same task has been eliminated. Moreover, because the ejector device 1 is installed adjacent to said one edge 24 of the circuit board 21 of the mobile module 2, the force for removing the module terminals from the main board 3 can be disposed as close as possible ana can be uniformly applied to the module terminals to avoid damaging the same.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An ejector device for removing a mobile module from a main board, the mobile module including a circuit board, a processing unit mounted on one side of the circuit board, and a set of module terminals mounted on the other side of the circuit board opposite to the processing unit, the module terminals being disposed proximate to one edge of the circuit board and being inserted removably into the main board for establishing electrical connection between the mobile module and the main board, said ejector device comprising:

a support frame adapted to be secured on the main board so as to extend in a direction transverse to a plane of the main board and adapted to be disposed adjacent to said one edge of the circuit board; and a lever including
an ejecting plate portion that is adapted to be disposed between the main board and the circuit board of the mobile module,
a connecting plate portion that extends from said ejecting plate portion and that is adapted to be disposed between said support frame and said one edge of the circuit board, said connecting plate portion being mounted pivotally on said support frame about an axis parallel to the plane of the main board, and
an operating plate portion that extends from said connecting plate portion and that is operable to cause said connecting plate portion to pivot relative to said support frame and enable said ejecting plate portion to push the circuit board of the mobile module away from the main board for removing the module terminals of the mobile module from the main board.

\* \* \* \* \*